United States Patent
He et al.

(10) Patent No.: US 12,104,054 B2
(45) Date of Patent: Oct. 1, 2024

(54) RESIN COMPOSITION, PREPREG CONTAINING SAME, LAMINATE, AND PRINTED CIRCUIT BOARD

(71) Applicant: SHENGYI TECHNOLOGY CO., LTD., Guangdong (CN)

(72) Inventors: Liexiang He, Guangdong (CN); Yongnian Qi, Guangdong (CN); Xianping Zeng, Guangdong (CN); Zhongqiang Yang, Guangdong (CN); Hualin Pan, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 512 days.

(21) Appl. No.: 17/437,555

(22) PCT Filed: Apr. 8, 2019

(86) PCT No.: PCT/CN2019/081741
§ 371 (c)(1),
(2) Date: Sep. 9, 2021

(87) PCT Pub. No.: WO2020/186571
PCT Pub. Date: Sep. 24, 2020

(65) Prior Publication Data
US 2022/0153989 A1   May 19, 2022

(30) Foreign Application Priority Data
Mar. 18, 2019 (CN) .......................... 201910206965.9

(51) Int. Cl.
  C08L 63/04      (2006.01)
  C08J 5/24       (2006.01)
  C08K 3/013      (2018.01)
  C08K 5/00       (2006.01)

(52) U.S. Cl.
  CPC .............. *C08L 63/04* (2013.01); *C08J 5/244* (2021.05); *C08J 5/249* (2021.05); *C08K 3/013* (2018.01); *C08K 5/0066* (2013.01); *C08J 2363/04* (2013.01); *C08L 2201/02* (2013.01); *C08L 2203/20* (2013.01)

(58) Field of Classification Search
None
See application file for complete search history.

(56) References Cited

U.S. PATENT DOCUMENTS

2018/0223094 A1   8/2018  Chen et al.
2018/0326708 A1*  11/2018 Piotrowski .......... H05K 1/0326
2019/0284402 A1*  9/2019  Piotrowski ............... C09D 7/20

FOREIGN PATENT DOCUMENTS

| CN | 103351578 A | 10/2013 |
| CN | 103965587 A | 8/2014 |
| CN | 103965588 A | 8/2014 |
| CN | 103992621 A | 8/2014 |
| CN | 108219371 A | 6/2018 |
| CN | 108350157 A | 7/2018 |
| CN | 108976705 A | 12/2018 |
| WO | 2018102177 A1 | 6/2018 |
| WO | 2018223524 A1 | 12/2018 |

OTHER PUBLICATIONS

Second Office Action, CN Application No. 201910206965.9.
International Search Report mailed Dec. 26, 2019; International Patent Application No. PCT/CN2019-081741 filed on Apr. 8, 2019. ISA/CN.
Office Action, CN Application No. 2019102069659.
First Office Action, CN Application No. 201910206965.9.
Supplementary Search Report, CN Application No. 2019102069659.

* cited by examiner

*Primary Examiner* — Megan McCulley
(74) *Attorney, Agent, or Firm* — McDonald Hopkins LLC

(57) ABSTRACT

The present disclosure discloses a resin composition, and a prepreg, a laminate and a printed circuit board containing the same. The resin composition comprises 100 parts by weight of a halogen-free epoxy resin, 11-37 parts by weight of an active ester resin, and 40-66 parts by weight of a compound represented by Formula (I), wherein n is 2-15; Ac represents an acetyl group. The prepreg, laminate and printed circuit board prepared from such resin composition have a low dielectric loss factor, good flame retardancy, and also have high interlaminar adhesion and a low CTE.

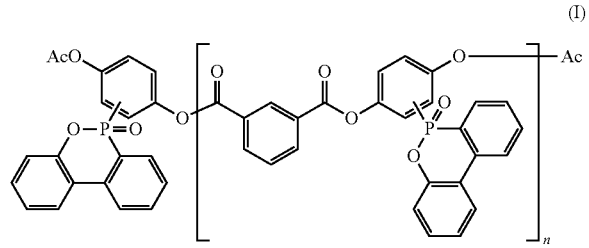

10 Claims, No Drawings

RESIN COMPOSITION, PREPREG CONTAINING SAME, LAMINATE, AND PRINTED CIRCUIT BOARD

CROSS-REFERENCE TO RELATED APPLICATION

This application is a 35 U.S.C. 371 national stage filing of PCT Application No. PCT/CN2019/081741 filed on Apr. 8, 2019, which claims priority to Chinese patent application No. 201910206965.9 filed with CNIPA on Mar. 18, 2019, the disclosures of which is are incorporated herein by reference in their entireties

TECHNICAL FIELD

The present disclosure belongs to the technical field of printed circuit boards, and specifically discloses a resin composition, a prepreg, a laminate and a printed circuit board containing the same.

BACKGROUND ART

Resin prepregs are often used as substrate materials in printed circuit boards. In flame-retardant printed circuit boards, halogen flame retardants are generally used in resin compositions to achieve flame retardancy. However, when halogen flame retardants burn, they not only emit a large amount of smoke and have an unpleasant smell, but also produce highly corrosive hydrogen halide gas and carcinogens such as dioxins and dibenzofurans. Therefore, there is a need to develop resin compositions for laminates used in halogen-free flame-retardant printed circuits.

Currently, some resin compositions in which phosphorus-containing compounds are used to replace halogen flame retardants as flame retardants have been developed. On such basis, it is also necessary to improve the flame-retardant resin composition containing phosphorus-containing compounds in order to make printed circuit boards have better overall performance, especially dielectric properties.

DISCLOSURE OF THE INVENTION

In one aspect, the present disclosure discloses a resin composition, comprising:
100 parts by weight of a halogen-free epoxy resin,
11-37 parts by weight of an active ester resin, and
40-66 parts by weight of a compound represented by Formula (I),

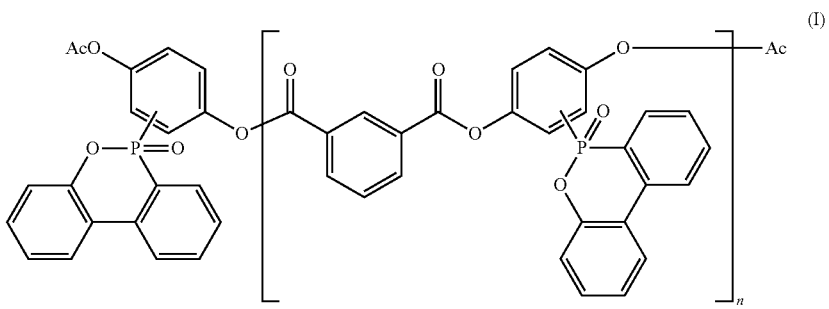

wherein n is 2-15; Ac represents an acetyl group.

Optionally, the halogen-free epoxy resin is selected from the group consisting of a biphenyl novolac epoxy resin, a DCPD novolac epoxy resin, an alkylene novolac epoxy resin, a bisphenol A novolac epoxy resin, a bisphenol AP epoxy resin, a bisphenol TMC epoxy resin, and combinations thereof.

Optionally, the active ester resin is a compound represented by Formula (II)

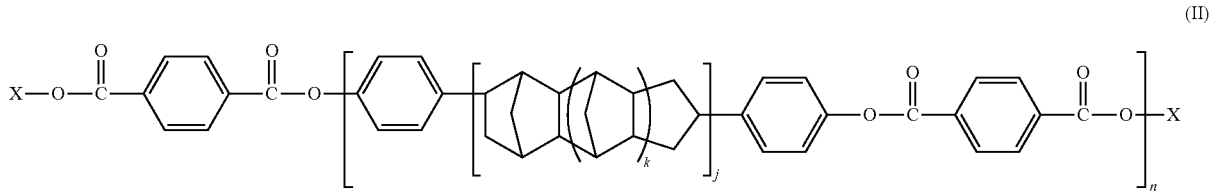

wherein X represents a phenyl group or a naphthyl group; j is 0 or 1; k is 0 or 1; n is 0.25-1.25.

Optionally, the active ester resin has a number average molecular weight of 800 or less.

Optionally, the active ester resin is present in an amount of 24-37 parts by weight. Optionally, the compound represented by Formula (I) is present in an amount of 40-53 parts by weight.

Optionally, the resin composition further comprises a cyanate ester or a prepolymer thereof. Optionally, the cyanate ester may be a cyanate ester compound containing at least 2 cyanooxy groups in the molecule, such as bisphenol A cyanate ester, or a prepolymer thereof. Optionally, the cyanate ester or a prepolymer thereof is present in an amount of 10-20 parts by weight, based on 100 parts by weight of the total amount of the halogen-free epoxy resin, the active ester resin and the compound represented by Formula (I).

Optionally, the resin composition further comprises a curing accelerator. Optionally, the curing accelerator is present in an amount of 0.05-1 part by weight, based on 100 parts by weight of the total amount of the halogen-free epoxy resin, the active ester resin and the compound represented by Formula (I). Optionally, the curing accelerator is selected from the group consisting of 4-dimethylaminopyridine, 2-methylimidazole, 2-methyl-4-ethylimidazole, 2-phenylimidazole, zinc isooctanoate and combinations thereof.

Optionally, the resin composition further comprises flame retardant salts. Optionally, the flame retardant salts are phosphate compounds. Optionally, the flame-retardant salts are present in an amount of 50 parts by weight or less, based on 100 parts by weight of the total amount of the halogen-free epoxy resin, the active ester resin and the compound represented by Formula (I).

Optionally, the resin composition further comprises a filler. Optionally, the filler is an organic and/or inorganic filler. Optionally, the filler is present in an amount of less than 100 parts by weight, based on 100 parts by weight of the total amount of the halogen-free epoxy resin, the active ester resin and the compound represented by Formula (I).

In another aspect, the present disclosure discloses a prepreg obtained by impregnating or coating a reinforcing material with the resin composition above and semi-curing the same.

In another aspect, the present disclosure discloses a laminate comprising at least one sheet of the prepreg above.

In another aspect, the present disclosure discloses a printed circuit board comprising at least one sheet of the prepreg or the laminate above.

EMBODIMENTS

The object of the present disclosure is to provide a resin composition. The resin composition can be used to prepare prepregs, and then to prepare laminates and printed circuit boards. The prepregs, laminates and printed circuit boards manufactured by using the composition have a low dielectric loss factor, good flame retardancy and, at the same time, have high interlaminar adhesion and a low CTE (coefficient of thermal expansion).

The inventors of the present disclosure unexpectedly discovered that, when the resin composition of the present disclosure comprises a compound represented by Formula (I), an active ester and an epoxy resin, the resulting product will have particularly excellent dielectric properties.

The present disclosure discloses a resin composition, comprising
- 100 parts by weight of a halogen-free epoxy resin,
- 11-37 parts by weight of an active ester resin, and
- 40-66 parts by weight of a compound represented by Formula (I),

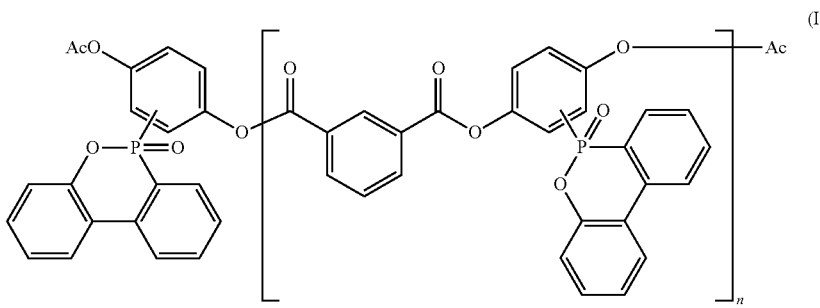

wherein n is 2-15; Ac represents an acetyl group.

In the present disclosure, the epoxy resin is used as a basic material to provide the cured product with excellent curing crosslinking density. In order to avoid the aforementioned shortcomings of halogen-containing printed circuit boards, the present disclosure selects a halogen-free epoxy resin containing no halogen.

In the present disclosure, the active ester resin is selected as a curing agent to effectively enhance the crosslinking and curing effect of the cured product.

In the present disclosure, a specific compound represented by Formula (I) is selected, and the compound has the function of improving the dielectric properties of the cured product.

In the present disclosure, the above-mentioned resin composition is obtained by using the mutual coordination and mutual synergistic promotion effect between the above three essential components. The prepregs, laminates and printed circuit boards manufactured by using the resin composition have a low dielectric loss factor, good flame retardancy and, at the same time, have high interlaminar adhesion and a low CTE.

The halogen-free epoxy resin component is a halogen-free epoxy resin. The present disclosure does not specifically limit the type of the halogen-free epoxy resin.

Preferably, the halogen-free epoxy resin is selected from the group consisting of a biphenyl novolac epoxy resin, a DCPD novolac epoxy resin, an alkylene novolac epoxy resin, a bisphenol A novolac epoxy resin, a bisphenol AP epoxy resin, a bisphenol TMC epoxy resin, and combinations thereof. The advantages of these halogen-free epoxy resins lie in their low coefficient of thermal expansion and dielectric properties.

Another essential component of the present disclosure is an active ester resin. The active ester resin refers to a compound containing at least one active ester group in the molecule.

The active ester resin is present in an amount of 11-37 parts by weight, and may be, for example, 11, 15, 25, 30 or 37 parts by weight, preferably 24-37 parts by weight. Within this range, the advantage is that it has a better dielectric loss factor.

Preferably, the active ester resin is a compound represented by Formula (II)

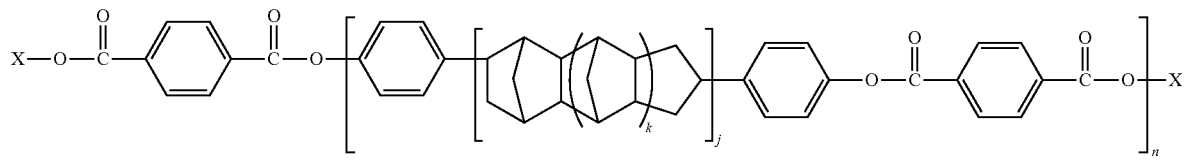

wherein X represents a phenyl group or a naphthyl group; j is 0 or 1; k is 0 or 1; n is 0.25-1.25.

Due to the special structure of the active ester, the rigid structures such as benzene ring, naphthalene ring, and cyclopentadiene impart high heat resistance to the active ester. Meanwhile, the regularity of its structure and no production of secondary hydroxyl groups during the reaction with epoxy resin give good electrical properties and low water absorption.

The inventors of the present disclosure further unexpectedly discovered that, when the number average molecular weight of the active ester in the resin composition of the present disclosure is controlled to be 800 or less, the dielectric properties of the resin composition can be further improved.

Preferably, the number average molecular weight of the active ester resin is 800 or less. When the number average molecular weight of the active ester resin is 800 or less, the dielectric properties thereof are better. Without relying on any theory, this may be because the active ester resin with a number average molecular weight of 800 or less can provide better wettability for the resin composition, thereby providing better dielectric properties for laminates and printed circuit board products.

In the resin composition of the present disclosure, the compound represented by Formula (I) is present in an amount of 40-66 parts by weight, and may be, for example, 40, 50, 55, 60 or 66 parts by weight, preferably 40-53 parts by weight. Within such range, the advantage is that it has a better dielectric loss factor.

The polymerization degree n of the compound represented by Formula (I) is 2-15, wherein n, for example, may be 3, 7, 11, or 15. In the present disclosure, n in the compound represented by Formula (I) in the composition may not be an integer, and it represents the average polymerization degree of the compound represented by Formula (I). For example, when half of the compound represented by Formula (I) in the composition has 3 repeating units, and the other half has 4 repeating units, it can be considered that n=3.5. When the average polymerization degree is less than 2, the composition has poor thermal properties after curing. The compound represented by Formula (I) is a polymer, in which there will be some components having particularly large molecular weight. The components having large molecular weight will affect the wettability of the resin composition in the epoxy resin and active ester resin system, which is manifested as the phenomenon that the base material of laminate or printed circuit board has weave exposure or white streaks in the sub-appearance. The inventors of the present disclosure unexpectedly discovered that by using an active ester resin with a molecular weight of 800 or less in the system of the present disclosure, the adverse effect of the portion having a high molecular weight of the compound represented by Formula (I) on the wettability can be effectively balanced, so as to improve the wettability and provide better dielectric properties. However, when the average polymerization degree is higher than 15, the active ester resin is not enough to restore wettability, and the dielectric properties of prepregs and the like made from the composition are not good enough. The number average molecular weight of the compound represented by Formula (I) is about 1300 to 7800 accordingly.

Preferably, the resin composition may further include a cyanate ester or a prepolymer thereof, which can increase the glass transition temperature of the composition, and simultaneously realize N-P synergistic flame retardancy with the compound represented by Formula (I), thereby improving the flame retardant efficiency.

More preferably, the cyanate ester may be a cyanate ester compound containing at least 2 cyanooxy groups in the molecule, such as bisphenol A cyanate ester, or a prepolymer thereof, which can better improve the glass transition temperature of the composition.

Based on 100 parts by weight of the total amount of the halogen-free epoxy resin, the active ester resin and the compound represented by Formula (I), the cyanate ester or a prepolymer thereof may be present in an amount of 10-20 parts by weight, e.g. 10, 12, 14, 16, 18 or 20 parts by weight.

Preferably, the resin composition further comprises a curing accelerator, which cures the resin and accelerates the curing speed of the resin.

Preferably, based on 100 parts by weight of the total amount of the halogen-free epoxy resin, the active ester resin and the compound represented by Formula (I), the curing accelerator is present in an amount of 0.05 to 1 part by weight, e.g. 0.08, 0.1, 0.15, 0.2, 0.25, 0.3, 0.35, 0.4, 0.45, 0.5, 0.55, 0.60, 0.65, 0.7, 0.75, 0.8, 0.85, 0.9 or 0.95 parts by weight.

Preferably, the curing accelerator is selected from the group consisting of 4-dimethylaminopyridine, 2-methylimidazole, 2-methyl-4-ethylimidazole, 2-phenylimidazole, zinc isooctanoate and combinations thereof.

In order to further improve the flame-retardant characteristic of the resin composition, the resin composition, preferably, may further include flame-retardant salts, such as phosphate compounds, but it is not limited thereto. Phosphate compounds include nitrogen-containing phosphate compounds.

Preferably, the amount of the flame-retardant salts is 50 parts by weight or less, e.g. 5, 10, 15, 20, 25, 30, 35, 40, 45 or 50 parts by weight, based on 100 parts by weight of the total amount of the halogen-free epoxy resin, the active ester resin and the compound represented by Formula (I).

Preferably, the resin composition further contains a filler, which is an organic and/or inorganic filler and is mainly used to adjust some of the physical properties of the composition, such as reducing the coefficient of thermal expansion (CTE), reducing water absorption and improving the thermal conductivity rate etc.

Preferably, the amount of the filler is 100 parts by weight or less, preferably 50 parts by weight or less, based on 100 parts by weight of the total amount of the halogen-free epoxy resin, the active ester resin and the compound represented by Formula (I). The amount of the filler is, for example, 0.5, 1, 5, 10, 15, 20, 25, 30, 35, 40, 45, 50, 55, 60, 65, 70, 75, 80, 85, 90 or 95 parts by weight.

Preferably, the inorganic filler is any one selected from the group consisting of fused silica, crystalline silica, spherical silica, hollow silica, aluminum hydroxide, alumina, talc powder, aluminum nitride, boron nitride, carbonized silicon, barium sulfate, barium titanate, strontium titanate, calcium carbonate, calcium silicate, mica, glass fiber powder, and a mixture of at least two selected therefrom. The mixture is, for example, selected from the group consisting of a mixture of fused silica and crystalline silica, a mixture of spherical silica and hollow silica, a mixture of aluminum hydroxide and aluminum oxide, a mixture of talc powder and aluminum nitride, a mixture of boron nitride and silicon carbide, a mixture of barium sulfate and barium titanate, a mixture of strontium titanate and calcium carbonate, a mixture of calcium silicate, mica and glass fiber powder, a mixture of fused silica, crystalline silica and spherical silica, a mixture of hollow silica, aluminum hydroxide and alumina, a mixture of talc powder, aluminum nitride and boron nitride, a mixture of silicon carbide, barium sulfate and barium titanate, a mixture of strontium titanate, calcium carbonate, calcium silicate, mica and glass fiber powder.

Preferably, the organic filler is any one selected from the group consisting of polytetrafluoroethylene powder, polyphenylene sulfide, polyethersulfone powder, and a mixture of at least two selected therefrom. The mixture is, for example, selected from the group consisting of a mixture of polytetrafluoroethylene powder and polyphenylene sulfide, a mixture of polyethersulfone powder and polytetrafluoroethylene powder, a mixture of polyphenylene sulfide and polyethersulfone powder, a mixture of polytetrafluoroethylene powder, polyphenylene sulfide and polyethersulfone powder.

Preferably, the filler is silica, and has a median particle size of 1-15 μm, preferably 1-10 μm.

The expression "comprising/comprises" mentioned in the present disclosure means that in addition to the aforementioned components, it can also contain other components which impart different characteristics to the resin composition. In addition, the expression "comprising/comprises" mentioned in the present disclosure can also be replaced with a closed expression "being/is (are)" or "consisting/(consists) of".

For example, the resin composition may further contain various additives. Specific examples include antioxidants, heat stabilizers, antistatic agents, ultraviolet absorbers, pigments, colorants, lubricants, and the like. These various additives can be used alone or in combination.

The conventional production method of the resin composition of the present disclosure comprises: taking a container, putting solid components in first, then adding a liquid solvent, stirring until completely dissolved, adding a liquid resin, a filler, a flame retardant and a curing accelerator, continuing to stir evenly and finally adjusting the solid content of the liquid to 60%-80% with a solvent to make a glue.

The second object of the present disclosure is to provide a prepreg comprising a reinforcing material and the resin composition as described above attached thereto after impregnation and drying.

Exemplary reinforcing materials are non-woven fabrics and/or other fabrics, such as natural fibers, organic synthetic fibers, and inorganic fibers.

The glue is used to impregnate reinforcing materials such as glass cloth and other fabrics or organic fabrics, and the impregnated reinforcing materials are heated and dried in an oven at 155-170° C. for 5-10 minutes to obtain a prepreg.

The third object of the present disclosure is to provide a laminate comprising at least one sheet of the prepreg as described above.

The fourth object of the present disclosure is to provide a printed circuit board comprising at least one sheet of the prepreg or the laminate as described above.

The prepregs, laminates and printed circuit boards made from the resin composition of the present disclosure have a low dielectric loss factor, good flame retardancy and, at the same time, have high interlaminar adhesion and a low CTE.

The technical solutions of the present disclosure will be further illustrated by specific examples below.

The metal-clad laminate made from the resin composition above is tested to measure the interlaminar adhesion, CTE, and dielectric loss factor. The details are described below in the following examples, wherein the mass parts of organic resin are calculated by mass parts of organic solids.

The materials used in the examples of the present disclosure are as follows.

NC-3000H: Biphenyl novolac epoxy resin (available from Nippon Kayaku).

HPC-7200HHH: DCPD novolac epoxy resin (available from Japan DIC).

HPC-8000-65T: Active ester resin, a compound represented by Formula (II), with a number average molecular weight of 800 or more (available from Japan DIC).

HPC-8000L-65MT: Active ester resin, a compound represented by Formula (II), with a number average molecular weight of 800 or less (available from Japan DIC).

E15-152T: A compound represented by Formula (I) (available from ICL), where n is about 3.0.

Phosphorus-containing compound 1: Reactive phosphorus-containing flame retardant, prepared with reference to Preparation Example 1 in CN108976705 A.

Phosphorus-containing compound 2: Reactive phosphorus-containing flame retardant, prepared with reference to Preparation Example 2 in CN108976705A.

Phosphorus-containing compound 3: Phosphorus-containing novolac resin, prepared with reference to the preparation example in CN105778413A.

CE01PS: Bisphenol A cyanate ester (available from Yangzhou Tianqi Chemical).

FB-3Y: Silica filler (available from DENKA).

BYK-W903: Filler dispersant (available from BYK).

DMAP: Curing accelerator, 4-dimethylaminopyridine (available from Guangrong Chemical).

Zinc isooctanoate: Curing accelerator (available from Alfa Aesar).

The test methods for various properties are as follows.

(1) Interlaminar adhesion (axe-blade separation method): peeling off two layers of adhesive sheets about 20 mm at one end of a copper clad laminate sample (with a width of 3 mm, and a length of 150 mm) by a knife, clamping the sample on a test fixture and fixing the upper and lower ends to keep the sample in a vertical state; peeling one end of the test strip across the blade of an axe-shaped test head, and keeping the separated surface of the sample on the same axis as the blade of the axe; starting a peel strength tester and applying a tensile force in the vertical direction at a speed of 50 mm/min; and separating the sample with the blade of the axe at least 50 mm, and the interlaminar adhesion is the average separation force of the sample/the width of the sample.

(2) Coefficient of Thermal Expansion (CTE): measured by using thermomechanical analysis method (TMA) according to the TMA method specified in IPC-TM-6502.4.24.

(3) Dielectric loss factor: measured according to the method specified in IEC 61189-2-721 (SPDR), wherein the test frequency is 10 GHz.

(4) Molecular weight: based on the test method specified in GB/T 21863-2008 Gel Permeation Chromatography (GPC). Tetrahydrofuran as elution solvent.

(5) Sub-appearance of the substrate: tested by using the standard method specified in IPC-TM-650, and judging whether there are any defects such as weave exposure and white streaks in the substrate by visual inspection or sectioning method.

Example 1

100 parts by weight of an epoxy resin HPC-7200-HHH and an appropriate amount of methylethyl ketone (MEK) were added to a container and stirred to dissolve. 37 parts by weight of an active ester resin HPC-8000-65T, 40 parts by weight of a compound E15-152T represented by Formula (I), 76 parts by weight of a silica filler FB-3Y and 0.76 parts by weight of a filler dispersant BYK-W903 were added and stirred. An appropriate amount of a curing accelerator DMAP was added to continue to stir evenly. Finally, the solid content of the liquid was adjusted to 70% with a solvent to make a glue. A 2116 glass fiber cloth was impregnated with the above glue and controlled to an appropriate thickness, and then dried to remove the solvent to obtain a prepreg. 6 sheets of the prepared prepregs were superimposed on each other, pressed with a piece of copper foil on both sides of the prepregs, put in a hot press for curing to form an epoxy resin copper clad laminate. The physical property data are shown in Table 1.

Examples 2-8

The manufacturing processes are the same as that in Example 1, and the formulations and their physical properties are shown in Table 1.

Comparative Examples 1-6

The manufacturing processes are the same as that in Example 1, and the formulations and their physical properties are shown in Table 1.

TABLE 1

| | | \multicolumn{7}{c}{Formulations and physical property data of each example} | | | | | | |
|---|---|---|---|---|---|---|---|---|
| Name | Substance | Example 1 | Example 2 | Example 3 | Example 4 | Example 5 | Example 6 | Example 7 |
|---|---|---|---|---|---|---|---|---|
| Epoxy resin | NC-3000 H | | 100 | 100 | 100 | 100 | 100 | 100 |
| | HPC-7200 HHH | 100 | | | | | | |
| Active ester resin | HPC-8000 L-65MT | 37 | 37 | 24 | 11 | 20 | 20 | |
| | HPC-8000-65T | | | | | | | 37 |
| Cyanate ester | CE01PS | | | | | 16 | 32 | |
| Compound represented by Formula (I) | E15-152T | 40 | 40 | 53 | 66 | 40 | 40 | 40 |
| Phosphorous-containing compound 1 | | | | | | | | |
| Phosphorous-containing compound 2 | | | | | | | | |
| Phosphorous-containing compound 3 | | | | | | | | |
| Filler | FB-3Y | 76 | 76 | 76 | 76 | 76 | 82 | 76 |
| Dispersant | BYK-W903 | 0.76 | 0.76 | 0.76 | 0.76 | 0.76 | 0.82 | 0.76 |
| Accelerator | DMAP | q.s. | q.s. | q.s. | q.s. | q.s. | q.s. | q.s. |
| | Zinc isooctanoate | | | | | | q.s. | q.s. |

TABLE 1-continued

Formulations and physical property data of each example

| Performance | Interlaminar adhesion | 0.60-1.00 | 0.80-1.20 | 0.82-1.22 | 0.85-1.25 | 0.70-1.10 | 0.65-1.05 | 0.78-1.18 |
|---|---|---|---|---|---|---|---|---|
| | CTE | 1.9% | 2.1% | 2.0% | 2.0% | 1.8% | 1.7% | 2.1% |
| | Df | 0.0078 | 0.0065 | 0.0067 | 0.0069 | 0.0067 | 0.0068 | 0.0070 |
| | Sub-appearance of substrate | OK | OK | OK | OK | OK | OK | A few white streaks in the board |

| Name | Substance | Example 8 | Comp. Example 1 | Comp. Example 2 | Comp. Example 3 | Comp. Example 4 | Comp. Example 5 | Comp. Example 6 |
|---|---|---|---|---|---|---|---|---|
| Epoxy resin | NC-3000 H | 100 | 100 | 100 | | 100 | 100 | 100 |
| | HPC-7200 HHH | | | | 100 | | | |
| Active ester resin | HPC-8000 L-65MT | 24 | 24 | 24 | 37 | | 24 | |
| | HPC-8000-65T | | | | | 37 | | |
| Cyanate ester | CE01PS | | | | | | | |
| Compound represented by Formula (I) | E15-152T | 53 | | | | | | 76 |
| Phosphorous-containing compound 1 | | | 53 | | | | 53 | |
| Phosphorous-containing compound 2 | | | | 53 | | | | |
| Phosphorous-containing compound 3 | | | | | | 66 | 66 | |
| Filler | FB-3Y | | 76 | 76 | 87 | 87 | | 76 |
| Dispersant | BYK-W903 | | 0.76 | 0.76 | 0.87 | 0.87 | | 0.76 |
| Accelerator | DMAP | q.s. | q.s. | q.s. | q.s. | q.s. | q.s. | q.s. |
| | Zinc isooctanoate | | | | | | | |
| Performance | Interlaminar adhesion | 1.02-1.42 | 0.60-1.00 | 0.70-1.10 | 0.40-0.80 | 0.45-0.85 | 0.80-1.20 | 0.62-1.02 |
| | CTE | 2.5% | 2.0% | 2.1% | 2.6% | 2.8% | 2.5% | 1.9% |
| | Df | 0.0087 | 0.0086 | 0.0083 | 0.0098 | 0.0088 | 0.0110 | 0.0081 |
| | Sub-appearance of substrate | OK | OK | OK | OK | A few white streaks in the board | OK | More white streaks in the board |

Note:
all the components in the table are calculated by parts by weight of solid components.

It can be seen from the physical property data in Table 1 that the compound represented by Formula (I) is not used in the compositions of Comparative Examples 1-5; and the dielectric loss factors of Example 1-7 are significantly lower than that of Comparative Examples 1-5. It is beneficial to use a filler for obtaining a low dielectric loss factor. By comparing Example 8 and Comparative Example 5 which used no filler, the dielectric loss factor of Example 8 is also significantly lower than that in Comparative Example 5 in which the compound represented by Formula (I) is not used. It is disclosed in Examples 1-8 that the composition composed of a blend of a halogen-free epoxy resin, an active ester resin, a compound represented by Formula (I) and other optional ingredients has a low dielectric loss factor, good flame retardancy, and, at the same time, high interlaminar adhesion and a low CTE.

More specifically, it is disclosed in Comparative Examples 1~4 to replace the compound represented by Formula (I) with different phosphorus-containing compounds as flame retardants. The results show that the dielectric loss factor of the product is 0.0083 or more, which is higher than that of Examples 1-7. In addition, the product has a dielectric loss factor of 0.0081, and more white streaks are distributed therein in Comparative Example 6 using only the compound represented by Formula (I) and an epoxy resin but not containing an active ester component. The results show that the active ester and the compound represented by Formula (I) have a synergistic effect, and can obtain good interlaminar adhesion while obtaining excellent dielectric properties.

In addition, by comparing Example 7 with Example 2, it can be seen that the performance difference between Example 7 and Example 2 is similar. However, in Example 7, there are a few white streaks in the substrate plate, and the Df is increased, indicating that adjusting the number average molecular weight of the active ester resin has a further optimization effect on the wettability and dielectric properties of the resin composition. From the comparison of Examples 2 and 7, it can be seen that the number average molecular weight of the active ester will affect the dielectric properties of the product. In addition, it can be seen from the comparison of Comparative Examples 3 and 4 that, when combined with other phosphorus-containing compound flame retardants, there is no correlation that the lower the number average molecular weight of the active ester resin is, the better the dielectric properties of the product are. This shows that the number average molecular weight of the active ester resin exhibits an advantageous effect on the dielectric properties only when used in combination with the compound represented by Formula (I) for the epoxy resin. Without relying on any theory, the inventor believes that the adverse effect of the compound represented by Formula (I) having a high molecular weight on the wettability can be effectively balanced by the active ester with a low number average molecular weight, so as to further improve the dielectric properties.

As described above, as compared to general laminates, the halogen-free circuit board of the present disclosure has a low dielectric loss factor and good flame retardancy, and also has high interlaminar adhesion and a low CTE at the same time.

Obviously, those skilled in the art can make various changes and modifications to the examples of the present disclosure without departing from the spirit and scope of the present disclosure. In this way, if these modifications and variations of the present disclosure fall within the scope of the claims of the present disclosure and equivalent technologies, the present disclosure also intends to include these modifications and variations.

The invention claimed is:

1. A resin composition, comprising:
    100 parts by weight of a halogen-free epoxy resin,
    11-37 parts by weight of an active ester resin, and
    40-66 parts by weight of a compound represented by Formula (I),

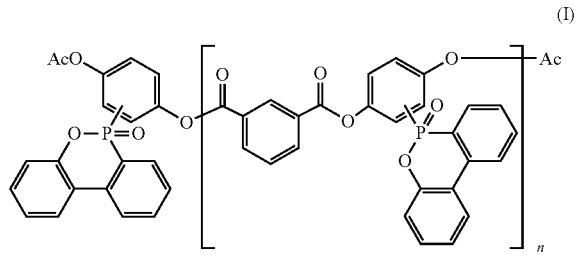

wherein n is 2-15; Ac represents an acetyl group;

wherein the active ester resin is a compound represented by Formula (II)

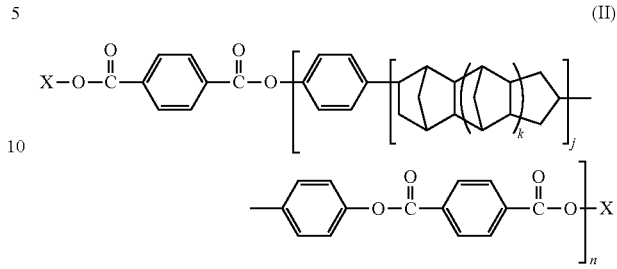

wherein X represents a phenyl group or a naphthyl group; j is 0 or 1; k is 0 or 1; n is 0.25-1.25;

wherein the active ester resin has a number average molecular weight of less than 800.

2. The resin composition claimed in claim 1, wherein the halogen-free epoxy resin is selected from the group consisting of a biphenyl novolac epoxy resin, a dicyclopentadiene (DCPD) novolac epoxy resin, an alkylene novolac epoxy resin, a bisphenol A novolac epoxy resin, a bisphenol AP epoxy resin, a bisphenol TMC epoxy resin, and combinations thereof.

3. The resin composition claimed in claim 1, wherein the resin composition further comprises a cyanate ester or a prepolymer thereof.

4. The resin composition claimed in claim 1, wherein the resin composition further comprises a curing accelerator.

5. The resin composition claimed in claim 1, wherein the resin composition further comprises flame retardant salts.

6. The resin composition claimed in claim 1, wherein the resin composition further comprises a filler.

7. A prepreg obtained by impregnating or coating a reinforcing material with the resin composition claimed in claim 1 and semi-curing the same.

8. A laminate comprising at least one sheet of the prepreg claimed in claim 7.

9. A printed circuit board comprising at least one sheet of the prepreg claimed in claim 7.

10. A printed circuit board comprising at least one sheet of the laminate claimed in claim 8.

* * * * *